(12) United States Patent
Ice

(10) Patent No.: US 7,562,804 B2
(45) Date of Patent: Jul. 21, 2009

(54) METHODS FOR MANUFACTURING OPTICAL MODULES USING LEAD FRAME CONNECTORS

(75) Inventor: Donald A. Ice, Milpitas, CA (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 10/810,040

(22) Filed: Mar. 26, 2004

(65) Prior Publication Data

US 2005/0189400 A1 Sep. 1, 2005

Related U.S. Application Data

(60) Provisional application No. 60/548,485, filed on Feb. 27, 2004.

(51) Int. Cl.
*B23K 31/02* (2006.01)

(52) U.S. Cl. .................. 228/173.1; 228/180.1

(58) Field of Classification Search ............ 228/180.21, 228/248.1
See application file for complete search history.

(56) References Cited

U.S. PATENT DOCUMENTS

| | | | |
|---|---|---|---|
| 4,471,158 A | 9/1984 | Roberts | |
| 4,593,463 A | 6/1986 | Kamono et al. | |
| 4,689,023 A | 8/1987 | Strong, III et al. | |
| 5,219,305 A | 6/1993 | Kawaguchi et al. | |
| 5,286,221 A | 2/1994 | Fencl et al. | |
| 5,295,214 A * | 3/1994 | Card et al. | 385/92 |
| 5,340,334 A | 8/1994 | Nguyen | |
| 5,613,880 A | 3/1997 | Wang | |
| 5,619,794 A | 4/1997 | Hokazono | |
| 5,632,630 A * | 5/1997 | Card et al. | 439/79 |
| 5,663,526 A | 9/1997 | Card et al. | |
| 5,742,480 A | 4/1998 | Sawada | |
| 5,768,777 A | 6/1998 | Lemke | |
| 5,802,711 A | 9/1998 | Card et al. | |
| 6,068,523 A | 5/2000 | Takahashi | |
| 6,086,413 A | 7/2000 | Karasik et al. | |
| 6,125,535 A | 10/2000 | Chiou et al. | |

(Continued)

OTHER PUBLICATIONS

Dictionary.com, Support [online], Dictionary.com Unabridged (v 1.1), Random House, Inc., 2006 [Retrieved on Jun. 13, 2007], Retrieved from the Internet:<URL:http://www.dictionary.reference.com/browse/support>, defintions for "noun" (specifically 12-14).*

(Continued)

*Primary Examiner*—Kiley Stoner
(74) *Attorney, Agent, or Firm*—Workman Nydegger

(57) ABSTRACT

Methods of manufacturing optical transceiver modules using lead frame connectors that connect optical sub-assemblies to printed circuit boards. The lead frame connectors include a conductive lead structure that is encased in an insert injection molded plastic casing. The lead frame connector is aligned with the leads that protrude from the back end of the corresponding optical sub-assembly (OSA). The leads pass through corresponding holes in the lead frame connector and are soldered to the conductors of the lead frame assembly. Once the soldering has been performed, the combined OSA and lead frame connector becomes a surface mount device that can then be mounted to the PCB. Assembling an optical transceiver using the lead frame connectors is generally less expensive and more reliable compared to the use of conventional flexible printed circuit board connectors.

20 Claims, 4 Drawing Sheets

U.S. PATENT DOCUMENTS

| | | | |
|---|---|---|---|
| 6,368,158 B1 | 4/2002 | Kan | |
| 6,454,618 B1 | 9/2002 | Andoh et al. | |
| 6,488,534 B2 | 12/2002 | Soga et al. | |
| 6,527,571 B2 | 3/2003 | Muta et al. | |
| 6,588,100 B2 | 7/2003 | Ma et al. | |
| 6,617,518 B2 | 9/2003 | Ames et al. | |
| 6,652,294 B1 | 11/2003 | Zhang | |
| 6,688,897 B2 | 2/2004 | Korsunsky et al. | |
| 6,762,119 B2 | 7/2004 | Ray et al. | |
| 6,764,336 B2 | 7/2004 | Ma et al. | |
| 6,764,338 B2 | 7/2004 | Fang | |
| 6,796,852 B2 | 9/2004 | Okamoto | |
| 6,817,782 B2 | 11/2004 | Togami et al. | |
| 6,922,231 B1 * | 7/2005 | Wang et al. | 356/73.1 |
| 6,966,800 B2 | 11/2005 | Mott | |
| 6,976,854 B2 | 12/2005 | Stockhaus et al. | |
| 7,097,468 B2 | 8/2006 | Ice | |
| 7,144,259 B2 | 12/2006 | Ice et al. | |
| 7,229,295 B2 | 6/2007 | Ice et al. | |
| 7,258,264 B2 | 8/2007 | Ice | |
| 7,311,530 B2 | 12/2007 | Ice | |
| 7,370,414 B2 | 5/2008 | Ice | |
| 2002/0196996 A1 | 12/2002 | Ray et al. | |
| 2003/0026081 A1 * | 2/2003 | Liu et al. | 361/760 |
| 2003/0085054 A1 * | 5/2003 | Ames et al. | 174/254 |
| 2003/0180012 A1 | 9/2003 | Deane et al. | |
| 2005/0142685 A1 | 6/2005 | Ouellet et al. | |
| 2005/0154618 A1 | 7/2005 | Kita | |
| 2005/0162761 A1 | 7/2005 | Hargis et al. | |
| 2005/0221637 A1 | 10/2005 | Ice et al. | |
| 2005/0232641 A1 | 10/2005 | Ice et al. | |
| 2006/0118807 A1 | 6/2006 | Ives et al. | |
| 2006/0140554 A1 | 6/2006 | Oki | |
| 2006/0252313 A1 | 11/2006 | Ice | |
| 2006/0263013 A1 | 11/2006 | Sone | |

OTHER PUBLICATIONS

U.S. Appl. No. 11/426,298, filed Jun. 23, 2006, Ice.
U.S. Appl. No. 11/066,030, filed Feb. 25, 2005, Ice.
U.S. Appl. No. 11/381,108, filed May 1, 2006, Ice.
U.S. Appl. No. 10/809,992, filed Mar. 8, 2005, Office Action.
U.S. Appl. No. 10/809,992, filed Sep. 23, 2005, Notice of Allowance.
U.S. Appl. No. 10/809,992, filed Apr. 14, 2006, Notice of Allowance.
U.S. Appl. No. 10/809,992, filed Jul. 21, 2006, Notice of Allowance.
U.S. Appl. No. 11/236,123, filed Feb. 12, 2006, Office Action.
U.S. Appl. No. 11/236,123, filed Jul. 31, 2006, Notice of Allowance.
U.S. Appl. No. 11/066,079, filed Jan. 24, 2006, Office Action.
U.S. Appl. No. 11/066,079, filed May 9, 2006, Office Action.
U.S. Appl. No. 11/066,079, filed Dec. 6, 2006, Office Action.
U.S. Appl. No. 11/066,079, filed Aug. 10, 2007, Notice of Allowance.
U.S. Appl. No. 11/468,752, filed Feb. 12, 2007, Notice of Allowance.
U.S. Appl. No. 10/810,040, filed Aug. 17, 2005, Office Action.
U.S. Appl. No. 11/066,056, filed May 22, 2006, Office Action.
U.S. Appl. No. 11/066,056, filed Nov. 22, 2006, Office Action.
U.S. Appl. No. 11/066,056, filed Apr. 17, 2008, Notice of Allowance.
U.S. Appl. No. 10/810,041, filed Nov. 9, 2006, Office Action.
U.S. Appl. No. 10/810,041, filed Jun. 21, 2007, Office Action.
U.S. Appl. No. 10/810,041, filed Jan. 9, 2008, Notice of Allowance.
U.S. Appl. No. 11/066,030, filed Sep. 25, 2007, Office Action.
U.S. Appl. No. 11/066,030, filed May 28, 2008, Office Action.
U.S. Appl. No. 11/381,108, filed Sep. 25, 2007, Office Action.
U.S. Appl. No. 11/381,108, filed May 7, 2008, Office Action.

* cited by examiner

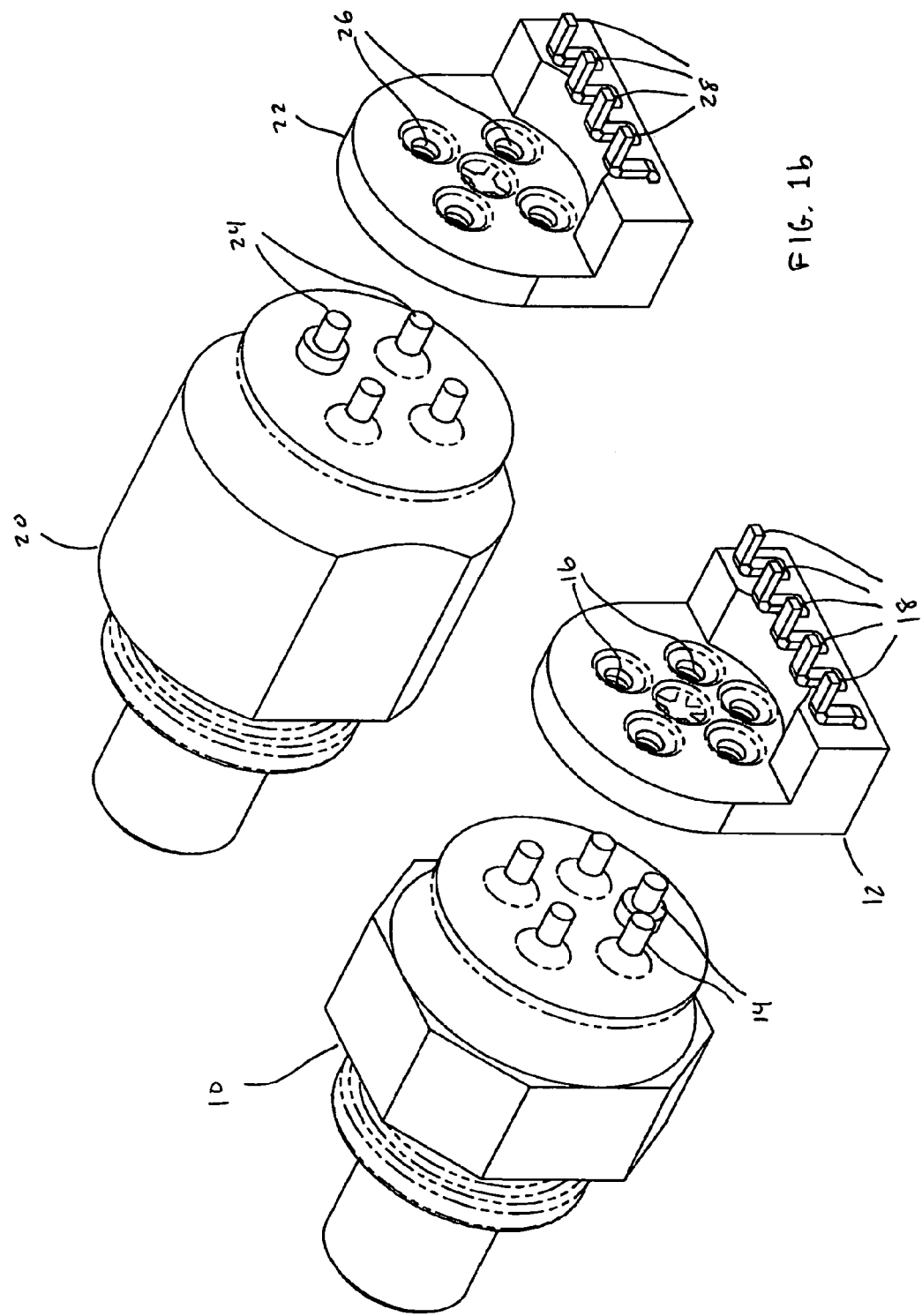

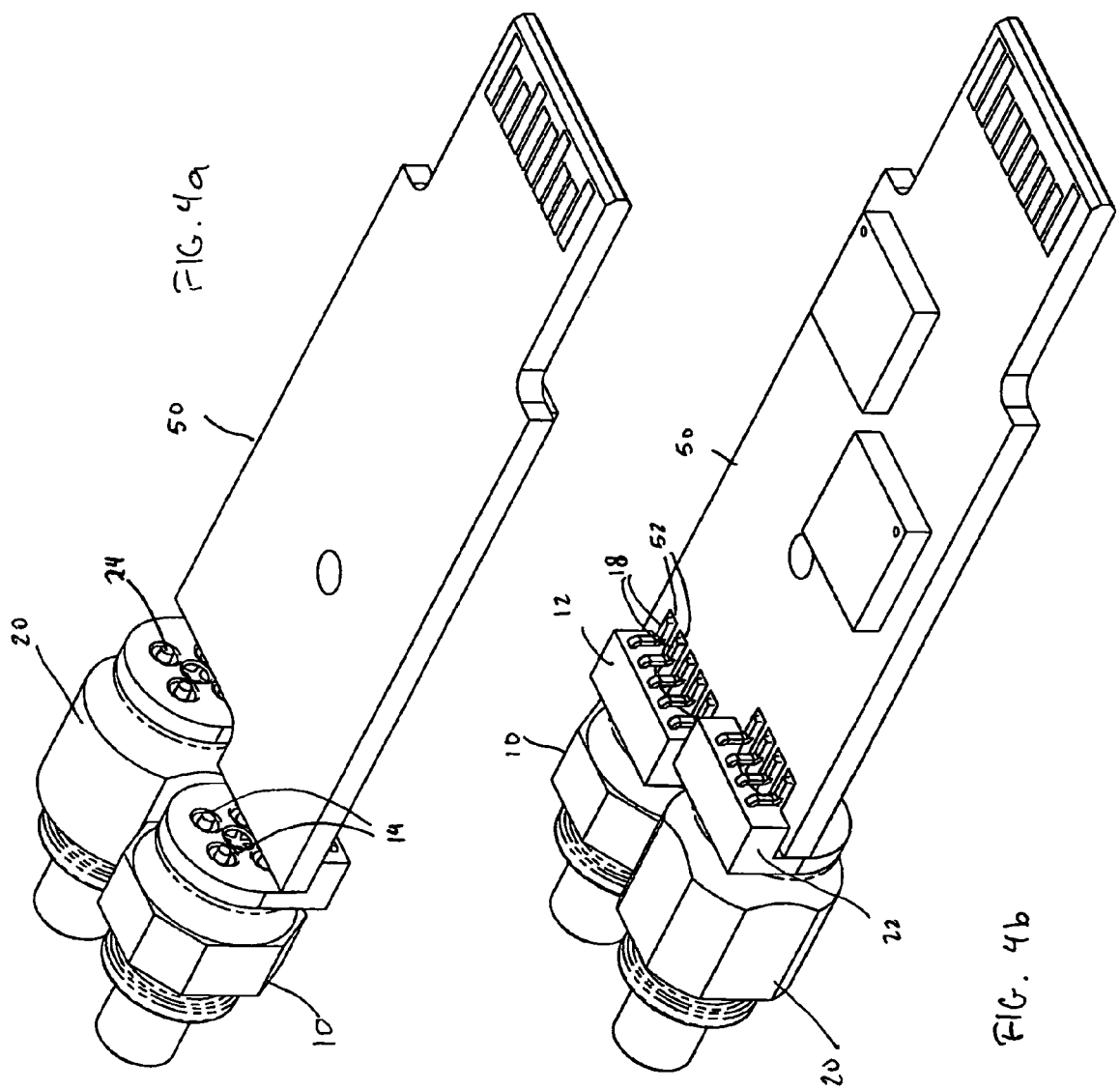

METHODS FOR MANUFACTURING OPTICAL MODULES USING LEAD FRAME CONNECTORS

RELATED APPLICATION

This application claims the benefit of U.S. Provisional Patent Application Ser. No. 60/548,485, filed Feb. 27, 2004, which is incorporated herein by reference.

BACKGROUND OF THE INVENTION

1. The Field of the Invention

The present invention relates generally to optical transceiver modules. More specifically, the present invention relates to methods of manufacturing optical transceiver modules using lead frame connectors that connect an optical sub-assembly to a printed circuit board in the optical transceiver module.

2. Background and Relevant Art

Optical transceivers are used to transmit and receive optical signals from an optical network and to enable electrical network components to interface with and communicate over optical networks. Many optical transceivers are modular and are designed in accordance with industry standards that define mechanical aspects of the transceivers, form factors, optical and electrical requirements, and other characteristics and requirements of the transceivers. For example the Small Form-Factor Module Multi-Source Agreement (SFF MSA), the Small Form-Factor Pluggable Module Multi-Source Agreement (SFP MSA) and the 10 Gigabit Small Form Factor Pluggable Module Multi-Source Agreement (XFP MSA) Revision 3.1 define such standards and are incorporated herein by reference.

The basic optical components of conventional transceivers include a transmitter optical sub-assembly (TOSA) and a receiver optical sub-assembly (ROSA). The TOSA receives electrical signals from a host device via circuitry of the transceiver module and generates a corresponding optical signal that is then transmitted to a remote node in an optical network. Conversely, the ROSA receives an incoming optical signal and outputs a corresponding electrical signal that can then be used or processed by the host device.

The electrical connections between the optical sub-assemblies and a printed circuit board (PCB) in the transceiver module have various electrical and mechanical requirements. One of the most common electrical connection components used in conventional optical transceiver modules is a flexible printed circuit board, or "flex circuit," that connects the rigid printed circuit board of the module to leads associated with the TOSA or ROSA. Flex circuits have several advantages, including good electrical performance and radio frequency response and the ability to take up tolerances in the modules and to withstand stresses that arise during manufacture and operation of the modules. Examples of flex circuits used in optical transceiver modules are described in U.S. patent application Ser. No. 10/409,837, filed Apr. 9, 2003, which is incorporated herein by reference. The foregoing patent application also illustrates other components of optical transceiver modules, such as TOSAs and ROSAs, and includes other general information regarding optical transceiver modules that is useful as background material for the invention described herein.

While flex circuits have been widely used in recent years in optical transceiver modules, flex circuits represent a significant portion of the costs and labor required to manufacture transceiver modules. As the price of transceiver modules drops, the costs associated with flex circuits continue to represent an increasing proportion of the overall costs of transceiver modules.

Other approaches to connecting optical sub-assemblies to printed circuit boards have been introduced in recent years. For example, the leads protruding from TOSAs and ROSAs can be bent into a configuration that enables the leads to be directly soldered or otherwise connected to the printed circuit board. This technique is often less expensive than the use of flex circuits, but can lead to unfavorable RF response due to the inability to carefully control impedances. In addition, machining leads of TOSAs and ROSAs introduces reliability risks due to the likelihood of damaging glass or other fragile portions of header assemblies in TOSAs and ROSAs that enclose the lasers and photodetectors, respectively.

Because of the possibility of damaging the TOSAs and ROSAs and poor electrical performance, bending leads to enable the optical sub-assemblies to be directly connected to the printed circuit board is not suitable for many transceiver modules. This approach is particularly unsuitable for relatively high-speed transceiver modules, in which the RF response of the conductors is more important.

BRIEF SUMMARY OF EMBODIMENTS OF THE INVENTION

The present invention relates to methods for manufacturing or assembling optical transceiver modules using lead frame connectors that electrically and mechanically connect optical sub-assemblies to printed circuit boards. The lead frame connectors enable optical sub-assemblies to be connected to the printed circuit board in optical transceiver modules in a reliable and inexpensive manner. The use of such lead frame connectors eliminates the need for flexible printed circuit boards that have been used in conventional transceiver modules.

According to one embodiment, the lead frame connector includes a stamped and bent conductive lead structure that is encased within an insert injection molded plastic casing. The plastic casing provides electrical insulation for the conductors in the lead frame as well as mechanical support for the finished component. The lead frame connectors connect to the leads associated with the optical sub-assemblies. The lead frame connectors also can be surface mounted onto the printed circuit board to establish connectivity between the optical sub-assembly and the printed circuit board. The lead frame connectors can be adapted for use with transmitter optical sub-assemblies and receiver optical sub-assemblies, and can have any necessary number of leads.

To assemble an optical transceiver module, the lead frame connector is aligned with the leads that protrude from the back end of the corresponding optical sub-assembly (OSA). The leads pass through corresponding holes in the lead frame connector and the leads are soldered to the conductors of the lead frame assembly. Once the soldering has been performed, the combined OSA and lead frame connector becomes a surface mount device that can then be mounted to the PCB.

In certain embodiments of the invention, the process of connecting the combined ROSA and lead frame connector to the PCB does not require epoxy reinforcement and avoids alignment handling issues that have been experienced in conventional methods of connecting optical sub-assemblies to PCBs using, for instance, flexible printed circuit boards.

The foregoing, together with other features and advantages of the present invention, will become more apparent when referred to the following specification, claims and accompanying drawings.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 1a illustrates a ROSA and a corresponding lead frame connector that is constructed according to an embodiment the invention.

FIG. 1b illustrates a TOSA and a corresponding lead frame connector that is constructed according to an embodiment of the invention.

FIG. 2a further illustrates the ROSA lead frame connector of FIG. 1a.

FIGS. 2c-2f illustrates various views of the ROSA lead frame connector of FIG. 1a.

FIGS. 4a and 4b are perspective views of opposite sides of a printed circuit board that has lead frame connectors attached thereto.

DETAILED DESCRIPTION OF THE PREFERRED EMBODIMENTS

Figure 2C:
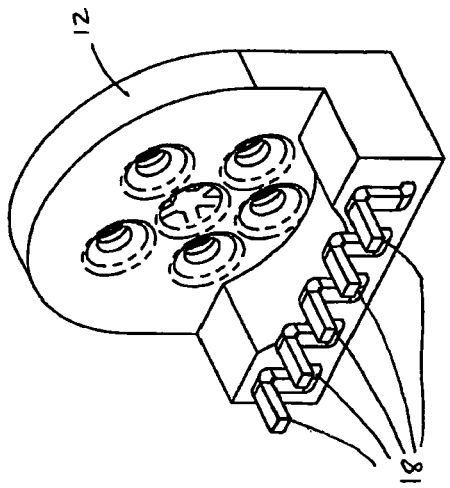

The present invention relates methods of manufacturing optical transceiver modules using lead frame connectors that electrically and mechanically connect optical sub-assemblies to printed circuit boards in optical transceiver modules. According to one embodiment, the lead frame connector is fabricated using an insert injection molding process applied to a reel-to-reel stamped lead frame ribbon. The lead frame connectors connect to the leads associated with the optical sub-assemblies. The lead frame connectors also can be surface mounted onto the printed circuit board to establish connectivity between the optical sub-assembly and the printed circuit board.

The lead frame connectors of the invention provide several advantages compared to the use of flex circuits or other conventional techniques. Compared to flex circuits, the lead frame connector components are significantly less expensive. In addition, the process of manufacturing a transceiver module using lead frame connectors is more automated and requires less labor. Compared to simply bending the leads of the optical sub-assemblies to permit direct connection to a PCB, the lead frame connectors have significantly better electrical performance and RF response. Moreover, there is no significant risk of damaging the fragile portions of the optical sub-assemblies during the process of connecting the optical sub-assemblies to the PCB.

1. Lead Frame Connector Structure

FIG. 1a illustrates a ROSA 10 and a corresponding lead frame connector 12 that is constructed according to an embodiment the invention. ROSAs typically have five leads 14, and the lead frame connector 12 of FIG. 1 a has five corresponding electrical contacts 16 and leads 18. FIG. 1b illustrates a TOSA 20 and a corresponding lead frame connector 22 that is constructed according to an embodiment of the invention. TOSAs typically have four leads 24, and the lead frame connector 22 of FIG. 1b has four corresponding electrical contacts 26 and leads 28. Although the lead frame connectors of FIGS. 1a and 1b are shown with four and five electrical contacts and leads, respectively, the principles of the invention disclosed herein can be applied to form lead frame connectors that have substantially any number of required electrical contacts and leads.

Figure 2B:
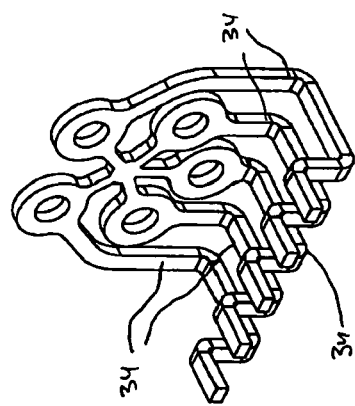
FIG. 2b illustrates a stamped and bent lead frame without the plastic casing that is insert injection molded around the lead frame.
Figure 2A:
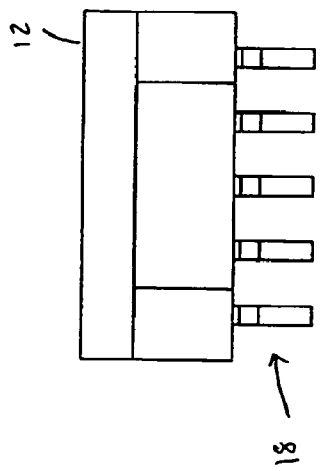
Figure 2F:
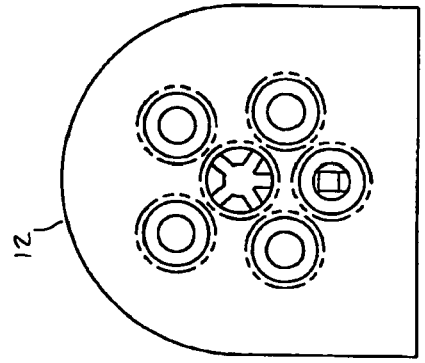
Figure 2E:
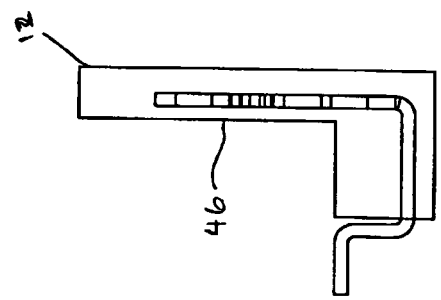
Figure 2D:
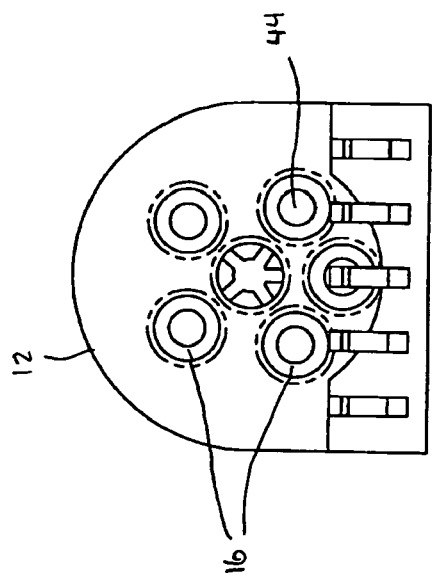
Figure 3C:
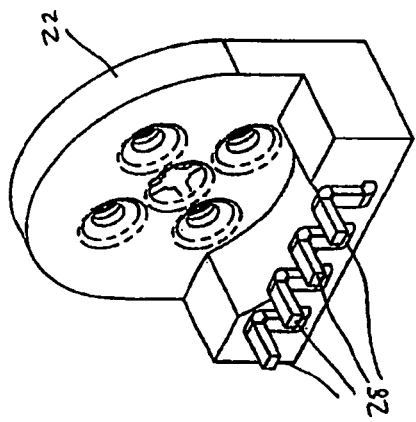
FIGS. 3c-3f illustrates various views of the TOSA lead frame connector of FIG. 1b.
Figure 3F:
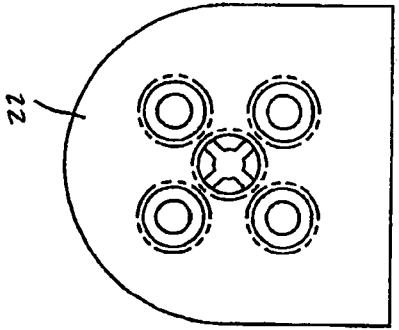
Figure 3B:
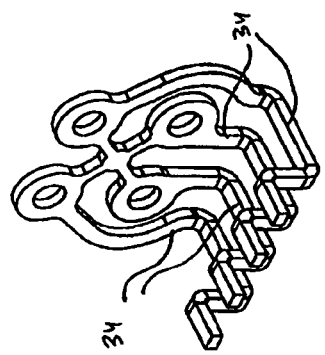
FIG. 3b illustrates a stamped and bent lead frame without the plastic casing that is insert injection molded around the lead frame.
Figure 3E:
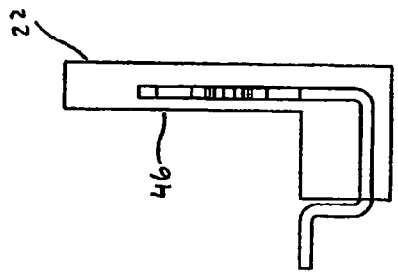
Figure 3A:
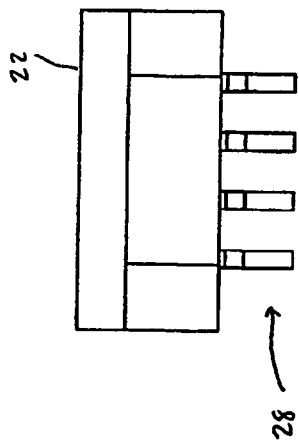
FIG. 3a further illustrates the TOSA lead frame connector of FIG. 1b.
Figure 3D:
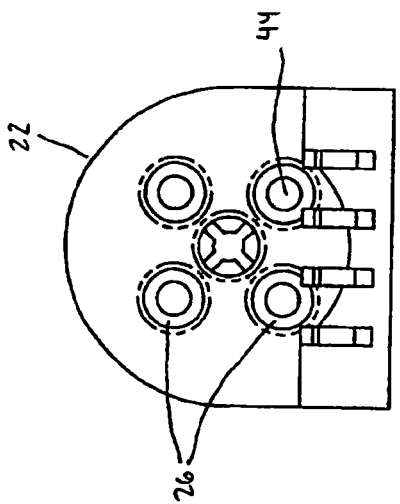

FIGS. 2a-2g and 3a-3g show various views of the lead frame connectors 12 and 22 of FIGS. 1a and 1b. U.S. patent application Ser. No. 10/809,992, entitled "Lead Frame for Connecting Optical Sub-Assembly to Printed Circuit Board," filed on the same day as the present application, is incorporated herein by reference and includes additional details of the structural features and electrical performance of the lead frame connectors illustrated in the drawings that accompany the present patent application.

2. Lead Frame Connector Fabrication Process

One of the advantages of the lead frame connectors of the invention is that they can have manufacturing costs that are much lower than the costs of manufacturing flex circuits that have conventionally been used in optical transceiver modules. In addition to the lead frame connectors themselves, the embodiments of the invention also extend to methods of manufacturing the lead frame connectors.

According to one embodiment, the method of manufacturing lead frame connectors 12 and 22 is performed using a reel-to-reel insert injection molding process. U.S. patent application Ser. No. 10/810,041, entitled "Methods of Manufacturing Lead Frame Connector for Connecting Optical Sub-Assembly to Printed Circuit Board," filed on the same day as the present application, is incorporated herein by reference and includes additional details of methods of manufacturing the lead frame connectors that can be used to manufacture optical transceiver modules according to the present invention. The foregoing patent application also describes techniques for reducing undesirable RF responses during the process of manufacturing the lead frame connectors 12 and 22.

3. Transceiver Manufacturing Process Using Lead Frame Connectors

FIGS. 4a and 4b illustrate opposite sides of a printed circuit board 50 that has lead frame connectors 12 and 22 attached thereto. The invention disclosed herein also extends to methods of manufacturing or assembling optical transceiver modules using the lead frame connectors 12 and 22. According to one embodiment, the method of manufacturing a transceiver module includes a step of connecting the lead frames 12 and 22 to the corresponding optical sub-assemblies 10 and 20. As the process is substantially the same for the ROSA 10 and the TOSA, the processing of only the ROSA is described in detail below.

The ROSA lead frame connector 12 is aligned with the leads 14 that protrude from the back end of the ROSA. The leads 14 pass through corresponding holes 44 in the ROSA lead frame connector 12 and the leads 14 are soldered to the conductors 34 of the lead frame assembly 12. Passing the leads 14 through the holes 44 in the corresponding electrical contacts 16 can result in substantial self-alignment of the lead frame connector 12 with the optical sub-assembly 10. As shown in FIG. 1*a*, the leads 14 of the ROSA 10 can be conveniently accessed from the opposite side 46 of the lead frame connector 12 to facilitate this soldering process. Once the soldering has been performed, the combined ROSA 10 and lead frame connector 12 becomes a surface mount device that can then be mounted to the PCB 50.

The process of surface mounting the combined ROSA 10 and lead frame connector 12 to the PCB 50 can be performed in any of a variety of ways. As shown in FIG. 4*b*, the lead frame connector 12 has an array of leads or pins 18 that are bent in a way that allows them to contact a corresponding array of pads 52 on the PCB 50. As the leads or pins 18 of the lead frame connector 12 are placed in contact with the pads 52, the physical connection is made by hand soldering, by reflow of a solder paste formed on the PCB 50, by a hot bar process, or by any other suitable technique. Another option is to use a fixture that facilitates the process of placing the lead frame connector to the PCB 50 and soldering it thereto.

It is noted that, according to certain embodiments of the invention, the process of connecting the combined ROSA and lead frame connector to the PCB does not require epoxy reinforcement and avoids alignment handling issues that have been experienced in conventional methods of connecting optical sub-assemblies to PCBs using, for instance, flex circuits.

The present invention may be embodied in other specific forms without departing from its spirit or essential characteristics. The described embodiments are to be considered in all respects only as illustrative and not restrictive.

I claim:

1. A method of manufacturing an optical transceiver module, comprising:
   connecting a plurality of electrical contacts of a lead frame connector to corresponding leads of an optical sub-assembly to obtain a combined structure that includes the lead frame connector and the optical sub-assembly;
   bending the plurality of electrical contacts at multiple discrete segments of the electrical contacts, wherein the electrical contacts are bent at multiple discrete segments thereof prior to connecting the plurality of electrical contacts of the lead frame connector to corresponding leads of the optical sub-assembly; and
   attaching the optical sub-assembly to a printed circuit board using the lead frame connector such that the lead frame connector electrically connects the optical sub-assembly to the printed circuit board and the lead frame connector provides mechanical support for the optical sub-assembly.

2. The method as defined in claim 1, wherein connecting the plurality of electrical contacts comprises:
   passing each of the leads of the optical sub-assembly through a hole in the corresponding electrical contact; and
   soldering the leads to the corresponding electrical contacts.

3. The method as defined in claim 2, wherein soldering the leads to the corresponding electrical contacts is performed by applying the solder to the electrical contacts at a side of the lead frame connector that is opposite a side that is adjacent to the optical sub-assembly.

4. The method as defined in claim 1, wherein connecting the plurality of leads of the lead frame connector to the corresponding conductive structures on a printed circuit board comprises:
   placing the leads of the lead frame connector in contact with the corresponding conductive structures; and
   reflow soldering the leads to the conductive structures.

5. The method as defined in claim 1, wherein connecting the plurality of leads of the lead frame connector to the corresponding conductive structures on a printed circuit board comprises:
   placing the leads of the lead frame connector in contact with the corresponding conductive structures; and
   connecting the leads to the conductive structures using a hot bar process.

6. The method as defined in claim 1, wherein the optical sub-assembly is a transmitter optical sub-assembly.

7. The method as defined in claim 1, wherein the optical sub-assembly is a receiver optical sub-assembly.

8. The method as defined in claim 1, wherein connecting the plurality of electrical contacts to corresponding leads includes self-alignment of the lead frame connector with respect to the optical sub-assembly as the corresponding leads pass through holes in the electrical contacts.

9. A method of manufacturing an optical transceiver module, comprising:
   obtaining a lead frame connector that includes:
     an electrically insulating casing; and
     a plurality of conductors that are electrically isolated one from another by the electrically insulating casing, the plurality of conductors forming:
       a plurality of electrical contacts that correspond to leads of the optical sub-assembly; and
       a plurality of leads that correspond to conductive structures on the printed circuit board;
   connecting the plurality of electrical contacts of the lead frame connector to the corresponding leads of an optical sub-assembly to obtain a combined structure that includes the lead frame connector and the optical sub-assembly;
   bending the plurality of electrical contacts at discrete segments of the electrical contacts, wherein the electrical contacts are bent at multiple discrete segments thereof prior to connecting the plurality of electrical contacts of the lead frame connector to corresponding leads of the optical sub-assembly; and
   attaching the optical sub-assembly to a printed circuit board using the lead frame connector such that the lead frame connector electrically connects the optical sub-assembly to the printed circuit board and the lead frame connector provides mechanical support for the optical sub-assembly.

10. The method as defined in claim 1, wherein attaching the optical assembly to the printed circuit board using the lead frame connector comprises connecting a plurality of leads of the lead frame connector to corresponding conductive structures on the printed circuit board of the optical transceiver module.

11. The method as defined in claim 1, wherein the electrical contacts are bent in different directions at segments thereof prior to attaching the optical sub-assembly to the printed circuit board using the lead frame connector.

12. The method as defined in claim 1, wherein two of the segments of the bent electrical contacts are encased within a plastic casing.

13. The method as defined in claim 1, wherein a first end of each of the electrical contacts is encased in a plastic casing and a second of each of the electrical contacts is not encased and capable of being soldered to the printed circuit board.

14. The method as defined in claim 1, wherein a bent portion of at least one of the electrical contacts is encased in a plastic casing.

15. The method as defined in claim 14, wherein the plastic casing provides mechanical support to the bent portion of the at least one of the electrical contacts encased within the plastic casing.

16. The method as defined in claim 1, wherein a portion of the lead frame connector between the optical subassembly and the printed circuit board is substantially rigid.

17. The method as defined in claim 1, wherein a bent portion of at least one of the electrical contacts is encased in a plastic casing.

18. The method as defined in claim 17, wherein the plastic casing provides mechanical stiffness to the bent portion of the at least one of the electrical contacts encased within the plastic casing.

19. The method as defined in claim 1, wherein a portion of the lead frame connector between the optical subassembly and the printed circuit board is substantially rigid.

20. The method as defined in claim 1, wherein a bent portion of at least one of the electrical contacts is encased in a plastic casing.

* * * * *